United States Patent
Wark et al.

[11] Patent Number: 5,847,445
[45] Date of Patent: Dec. 8, 1998

[54] DIE ASSEMBLIES USING SUSPENDED BOND WIRES, CARRIER SUBSTRATES AND DICE HAVING WIRE SUSPENSION STRUCTURES, AND METHODS OF FABRICATING SAME

[75] Inventors: James M. Wark; Salman Akram, both of Boise, Id.

[73] Assignee: Micron Technology, Inc., Boise, Id.

[21] Appl. No.: 740,882

[22] Filed: Nov. 4, 1996

[51] Int. Cl.⁶ ............................ H01L 23/28; H01L 23/12
[52] U.S. Cl. ........................ 257/669; 257/666; 257/668; 257/674; 257/698; 257/786
[58] Field of Search ................... 257/666, 669, 257/668, 674, 687, 688, 690–693, 698, 700, 786, 787

[56] References Cited

U.S. PATENT DOCUMENTS

| | | | |
|---|---|---|---|
| 3,757,175 | 9/1973 | Kim et al. | 257/668 |
| 4,264,917 | 4/1981 | Ugon | 257/668 |
| 4,567,643 | 2/1986 | Droguet et al. | 257/777 |
| 4,701,999 | 10/1987 | Palmer | 257/667 |
| 4,862,245 | 8/1989 | Pashby et al. | 257/668 |
| 4,943,843 | 7/1990 | Okinaga et al. | 257/692 |
| 4,984,059 | 1/1991 | Kubota | 257/676 |
| 5,027,190 | 6/1991 | Haghiri-Tehrani et al. | 257/669 |
| 5,073,817 | 12/1991 | Ueda | 257/787 |
| 5,170,930 | 12/1992 | Dolbear et al. | 257/724 |
| 5,173,766 | 12/1992 | Long et al. | 257/668 |
| 5,278,726 | 1/1994 | Bernardoni et al. | 257/787 |
| 5,386,342 | 1/1995 | Rostoker | 257/668 |
| 5,442,231 | 8/1995 | Miyamoto et al. | 257/668 |
| 5,467,253 | 11/1995 | Heckman et al. | 257/698 |
| 5,483,024 | 1/1996 | Russell et al. | 257/735 |
| 5,495,179 | 2/1996 | Wood et al. | 324/755 |
| 5,541,525 | 7/1996 | Wood et al. | 324/755 |
| 5,550,406 | 8/1996 | McCormick | 257/696 |
| 5,574,309 | 11/1996 | Papapietro et al. | 257/698 |
| 5,650,593 | 7/1997 | McMillan et al. | 257/787 |

FOREIGN PATENT DOCUMENTS

| | | | |
|---|---|---|---|
| 2-294044 | 12/1990 | Japan | 257/674 |
| 3-173165 | 7/1991 | Japan | 257/692 |
| 4-93052 | 3/1992 | Japan | 257/669 |
| 5-102224 | 4/1993 | Japan | 257/669 |

*Primary Examiner*—Tom Thomas
*Assistant Examiner*—Alexander Oscar Williams
*Attorney, Agent, or Firm*—Trask, Britt & Rossa

[57] ABSTRACT

A rail of non-conductive material is applied to a semiconductor die and/or to the carrier substrate to which it is or will be bonded. The rail underlies those wires joining the die bond pads and substrate traces, which wires have an inordinate length, i.e. greater than about 100 mils for 1.0 mil diameter wires, to prevent sagging wires from contacting the die edge and breaking, or shorting to active areas on the die or substrate. A pattern of rails may be formed on the dice of an undivided wafer by, for example, screen printing. Rails may also be formed on the substrate, and rails on the substrate employed in combination with rails on dice carried thereon.

75 Claims, 8 Drawing Sheets

DIE ASSEMBLIES USING SUSPENDED BOND WIRES, CARRIER SUBSTRATES AND DICE HAVING WIRE SUSPENSION STRUCTURES, AND METHODS OF FABRICATING SAME

BACKGROUND OF THE INVENTION

1. Field of the Invention

This invention relates generally to semiconductor chips. More particularly, this invention pertains to methods for wire bonding chips to carrier substrates in the manufacture of chip-and-wire modules and to the resulting multi-chip modules (MCMs).

2. State of the Art

A current preferred method of forming some semiconductor chip packages uses a die or chip with conductive bond pads which are aligned in one or two rows along a central axis of the active surface, rather than near the periphery as in prior die construction. This arrangement permits a so-called "leads-over-chip" (LOC) configuration, wherein leads of a lead frame extend over the top, i.e. active surface, of the chip and are bonded to the chip to support it. The leads are then wire bonded to the appropriate bond pads to effect the electrical connections, and the chip and leads are encapsulated in a plastic package. This method of chip manufacture is described in U.S. Pat. No. 4,862,245 of Pashby et al.

The use of the LOC design with such chips permits a larger chip to be molded in a given package size. Prior chip packages using chips having peripheral bond pads are attached to paddles of lead frames with leads which stopped short of extending over the chip, thus unduly limiting the chip size which could be accommodated by the standard package size. By using an LOC lead frame design with centrally padded chips, a 4 megabit DRAM (dynamic random access memory) chip may be replaced by, for example, a 16 megabit or 64 megabit DRAM chip in the same size transfer-molded plastic package. Thus, most currently produced memory chips of 16 or more megabits capacity are of the LOC configuration to conform the larger-capacity chips to standardized industry package sizing.

Chips with peripherally-located bond pads have been used for chip-and-wire modules, as disclosed in U.S. Pat. Nos. 4,264,917 and 4,567,643. Such chips typically offer short bond wire lengths to the terminals of the carrier substrate traces. However, as noted above, larger-capacity chips such as 16 or 64 megabit DRAMS are generally not fabricated with peripheral bond pads, due to the requirement of an LOC centralized-pad arrangement for LOC plastic packaging.

It would be desirable to use chips with centrally-arranged bond pads, such as LOC-configured chips, on chip-and-wire modules employing printed circuit boards (PCBs) and other carrier substrates attached by their back sides to the substrate with a direct chip attach (DCA) adhesive. Such chips might have all, or only a portion, of their conductive bond pads on or near a central axis of the active surface. The bond pads of the chips would be electrically connected to terminal areas of circuit traces on the substrate by metal wire, e.g. gold wire typically of 0.001 inch (1 mil) diameter. However, these very thin wires, stretching from the center row or rows of bond pads on the chip to the substrate terminal areas of the substrate, are inordinately long in terms of mechanical self-support and therefore tend to sag. The wires typically would exceed 100 mils in length, and might be more than 200 mils long, in which case the wires would probably not be able to sustain a position distant from the active surface or another bond pad. Such sagging wires could short circuit to the active surface of the chip, to another wire, to another bond pad of the chip, or to another terminal area of the substrate. The short circuit may be detected and require rework, or may only manifest itself after testing and burn-in and during the thermal cycling attendant to normal operation.

Furthermore, the weight of the wire itself could create a high stress point in the wire at or near the sharp edge of the chip, or adjacent a bond pad, causing wire breakage due to mechanical failure. This would result in additional short circuiting of wire ends to other bond pads, the active surface, or other wires. Repair of such breaks is a time consuming process. Even a small statistical occurrence of breakage, with its required rework, results in significant production cost increases.

To resolve the problem outlined above, wires of greater thickness (diameter) could be used, but this results in substantially increased cost arising from several sources:

a. added weight (mass) of gold wire will drive the chip cost upwards.

b. the resulting higher wire loop height of the stiffer wire above the chip would result in a thicker package and require additional "glob top" polymeric (usually silicone or epoxy) material to encapsulate the chip on the substrate, thus increasing the unit cost.

Aluminum wires might also be employed in lieu of gold for greater structural integrity, but aluminum is an inferior conductor to gold.

The process of manufacturing an integrated chip package is substantially completed upon completion of the wire-bonding step. Thus, failure and discard of the package at or after the wire-bonding step results in a substantial monetary loss. This is particularly true with respect to relatively expensive chips such as 32-bit microprocessors and 16-plus megabit memory chips.

U.S. Pat. No. 4,701,999 of Palmer teaches the use of a platen to receive the die pad or central support member and support lead fingers of a lead frame prior to making the wire bond connections, but the platen provides no support for the wires themselves.

Previously-referenced U.S. Pat. No. 4,862,245 of Pashby et al. discloses the use of an insulative polymeric alpha barrier separating the lead fingers from the active chip surface in a lead-over-chip (LOC) arrangement. Both the lead fingers and chip are bonded to the alpha barrier. However, the connecting wires are unsupported between the end connections and, furthermore, are relatively short, typically less than 30 mils long.

It would be advantageous to economically produce reliable wire bonded chip-on-substrate modules or packages employing chips having centrally-located bond pads, wherein wire sag, wire failure and shorting problems are overcome. It would also be desirable to fabricate chip-and-wire MCM assemblies using LOC-configured dice and a simple method for making same, with substantially enhanced reliability at minimal additional expense. Such assemblies may comprise large scale integrated circuit (LSIC) assemblies using a chip-and-wire configuration with LOC dice.

BRIEF SUMMARY OF THE INVENTION

To overcome the tendency of the long, thin wires of a centralized bond pad chip-on-substrate device to sag, bend and/or break under gravitational and other forces, the present invention uses an insulative support barrier or rail on the die and/or on the carrier substrate to support an intermediate portion of an elongate bond wire at a separate position on the barrier, prevent undue sagging, and insulate supported wires from other wires, the die's active surface, and conductive strips or traces of the carrier substrate. The rail may be positioned to support the wire in an intermediate position, i.e. anywhere between the bond pad connection and the conductive trace connection of the bond wire.

The insulative support barriers or rails are particularly useful where the die has at least one bond pad located along or near a central axis or, more broadly, in a central region of the active surface, so that the wire connecting it to a conductive strip on the substrate has an extended length, i.e. at least about 100 mils for a 1.0 mil diameter wire. The invention is of particular advantage where the majority of die bond pads are near the central axis or are otherwise remote from the periphery of the die. Such occurs in the standard LOC-configured dice normally used for plastic-packaged memory chips, and in dice configured with bond pad arrays for flip-chip attachment. The invention may also be used for wire bonded microprocessors.

The insulative barrier or rail may be preformed or applied to the substrate, e.g. printed circuit board or other insulative carrier substrate bearing circuit traces, prior to installing (adhering) the dice. Alternatively, the rail may be applied following dice adhesion but before bonding the connecting wires.

In another embodiment, the rail may be formed by applying an insulative strip, e.g. silicone, epoxy or polyimide material, to the die, or to the die and substrate, just prior to wire bonding.

In a further embodiment, the rail is applied by screen printing to all of the die locations of a wafer or other semiconductor substrate on which the dice have been fabricated before singulation thereof into individual dice.

As used herein, the term "rail" defines a segment of insulative material sufficiently high and of sufficient structural integrity to support at least one bond wire intermediate its bond pad and trace connections.

These and other embodiments and advantages of the invention will be readily understood by reading the following description in conjunction with the accompanying figures of the drawings, wherein like reference numerals have been applied to designate like elements throughout the several views. The elements are not generally shown to scale; thus, some dimensions are exaggerated for clarity in viewing.

DESCRIPTION OF THE PREFERRED EMBODIMENTS

Figure 1:
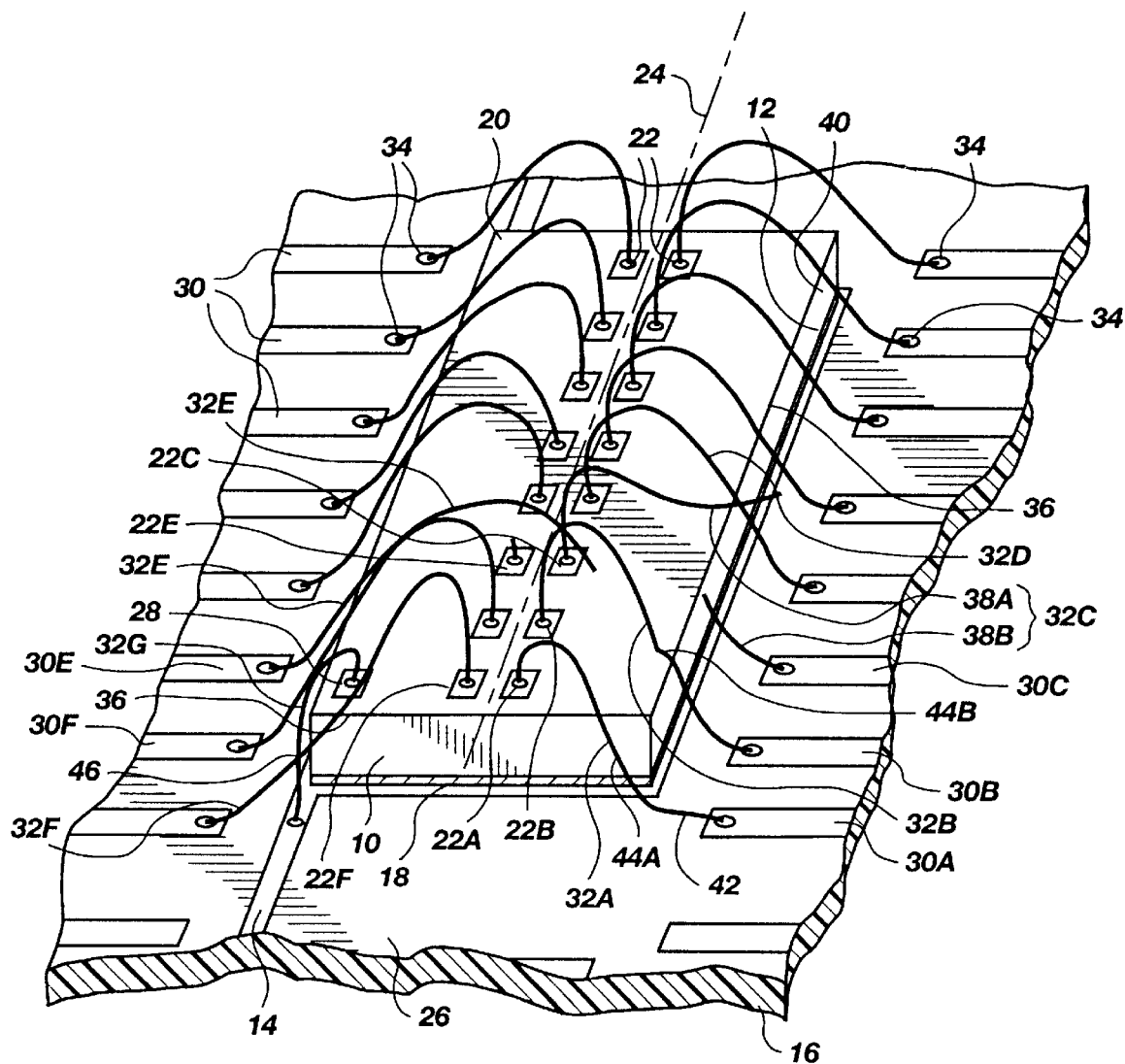
FIG. 1 is a perspective view of an LOC-configured semiconductor chip mounted on a carrier substrate without use of the present invention.

With reference to the drawings, and particularly to FIG. 1, a representative or exemplary, but fictitious, internal-array-pad die or leads-over-chip (LOC) type die 10 has its back surface 12 mounted by an adhesive layer 18 to a conductive member or pad 14 on a first surface 26 of a supporting insulating carrier substrate 16. Typically, conductive member 14 is at a ground or reference potential. The active surface 20 of the die 10 typically has one or two rows of conductive bond pads 22 on or along a central axis 24 of the active surface 20 and may also have one or more edge-mounted bond pads 28. Alternatively, die 10 may be of a centralized array configuration having bond pads in a rectangular, circular or other non-linear arrangement, such as may be employed for flip-chip type attachment to a carrier substrate.

Conductive strips or traces 30 are mounted on the substrate 16 for interconnection with bond pads 22 of the die 10 and with other circuit elements, not shown.

Fine wires 32 of about 1–1.5 mil diameter are shown attached to bond pads 22 and to terminal areas at the ends of corresponding conductive strips or traces 30, typically by thermocompression or thermosonic bonds 34. The term "remote" is applied herein to the distance between any bond pad 22 on a die 10 which is wire-bonded to a substrate 16, such that the wire length results in a tendency toward sagging of an intermediate portion of the wire 32. Wires 32 are typically gold, although silver, aluminum, aluminum alloy, copper, palladium and other metal wires are also employed.

Some of the problems which occur when such long, fine wires 32 are used to complete the electrical connections are illustrated in FIG. 1 as follows:

Wire 32A is shown bonded to bond pad 22A and to conductive strip or trace 30A. However, it has sagged downwardly to form a lower pendant portion 42 which is in shorting contact with the ground conductive member 14 which underlies the die 10. The wire 32A also is in contact with the sharp upper edge 36 of the die 10, which results in mechanical stress at the contact point 44A.

Wire 32B is shown bonded to bond pad 22B and to conductive strip or trace 30B. Wire 32B has sagged to contact the active surface 20 and edge 36 of the active surface, resulting in mechanical stress at the contact point 44B. The wire 32B has become bent about the sharp edge 36, making the wire susceptible to breakage, as where a glob-top encapsulant is applied.

Wire 32C is shown as having broken intermediate the bond pad 22C and the conductive strip or trace 30C because of high stress at the die edge 36. One portion 38A has short-circuited to wire 32D, and the other portion 38B is in contact with the side 40 of the die 10.

Wire 32E is shown as having been originally bonded to bond pad 22E and to conductive strip or trace 30E. Sagging of the wire 32E under its own weight resulted in breakage near the bond pad 22E, and the longer portion is shorted to bond pad 22C.

Where a long wire crosses another wire, even a slight degree of sagging may result in shorting of the wires. As illustrated in FIG. 1, wire 32F is connected to central bond pad 22F and conductive strip or trace 30F. Wire 32F crosses wire 32G, which is connected to peripheral bond pad 28 and the ground conductive member 14. Sagging of wire 32F has resulted in electrical contact with wire 32G at contact point 46.

Sagging of fine wires 32 typically may occur when the wire length exceeds about 100 mils for a 1–1.5 mil diameter wire, about 150 mils for a 2 mil diameter wire, and about 250 mils for a 2.5 mil diameter wire. The sagging and/or displacement of a wire 32 may be due to the force of gravity, artificial acceleration caused by handling equipment, extraneous contact with another object during fabrication, or other causes.

Figure 2:
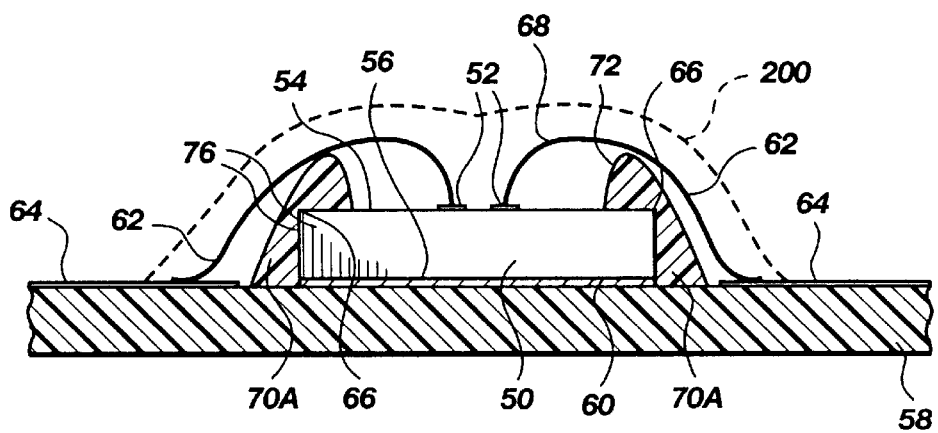
FIG. 2 is a cross-sectional view of a semiconductor chip mounted on a carrier substrate and having a preferred embodiment insulative support rail of the invention.
Figure 3:
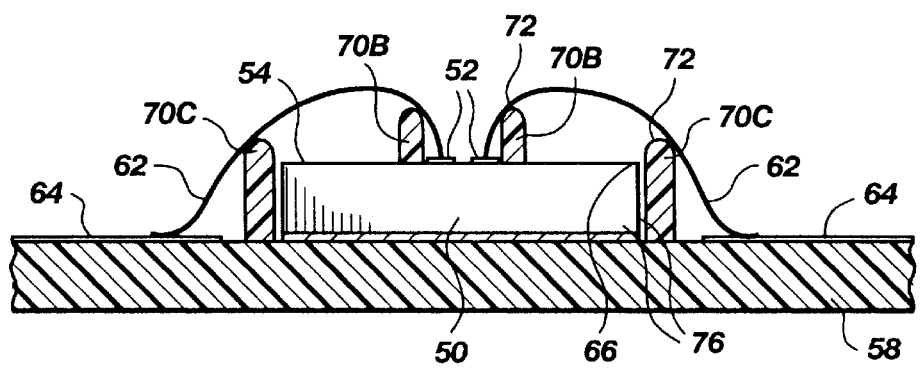
FIG. 3 is a cross-sectional view of a semiconductor chip mounted on a carrier substrate and having further preferred embodiments of an insulative support rail of the invention.
Figure 4:
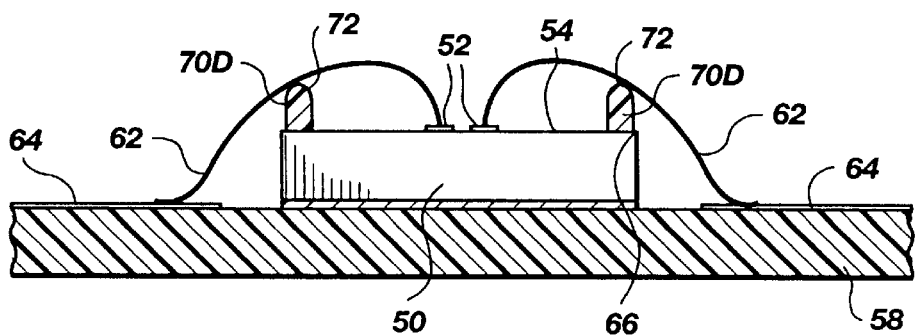
FIG. 4 is a cross-sectional view of a semiconductor chip mounted on a carrier substrate and having another preferred embodiment of an insulative support rail of the invention.

Turning now to FIGS. 2–4, we view various embodiments of the invention as applied to the foregoing problems in chip module construction.

In FIG. 2, a die 50 having centrally positioned bond pads 52 on the active surface 54 has its back side 56 attached to a substrate 58 by an adhesive layer 60. Prior to bonding wires 62 to the bond pads 52 and conductive traces or strips 64, a rail 70A comprising a bead of non-conductive polymeric material such as silicone, a non-conductive epoxy, or a polyimide is applied along an edge 66 of the active surface 54 of die 50 and downward to the substrate 58. The rail 70A has a rounded upper surface 72 which is positioned to intercept a wire 62 whose upper loop 68 has sagged. As shown, the sagging wire 62 is supported by the rail 70A to minimize sagging; thus undue stress is not placed on the wire connections at the bond pads 52, at the conductive strips 64 or intermediate the two. The wire 62 is thus not permitted to contact the active surface 54 or the sharp edge 66 thereof. The rail 70A prevents wire deformation during the package sealing step and becomes part of the package seal. As shown in broken lines 200, the structure of FIG. 2 (and of all of the other embodiments as well) may be encapsulated using methods and materials well known in the art.

The term "rail," "support" or "support member" is used herein in an exemplary rather than in a limiting sense. There is thus no restriction on a rail, support or support member structure as to linearity or non-linearity or a requirement that insulative support elements according to the invention be continuous in order to fall within the scope of the invention. Therefore, "dots" or "segments" of insulative support material may be employed if only one or two wires require support, or if a bond pad array configuration renders use of a continuous support element impractical. Further, insulative supports according to the invention may be of non-uniform height.

FIG. 3 shows a die 50 attached to substrate 58, as in FIG. 2. Wires 62, typically of 1.0–1.5 mil diameter and greater than about 100 mils length, are bonded to the central bond pads 52 and to conductive strips 64. A non-conductive support rail 70B has been bonded (if preformed) to or formed on the die 50 on the outward side of each row of bond pads 52. The rail 70B is applied to the die 50 just prior to bonding the wires 62 to the bond pads 52 and conductive strips 64. Alternatively, the rail 70B may be formed on the die 50 at the wafer level, as will be described later.

In FIG. 3, a further embodiment of the rail, noted here as 70C, is bonded to or formed on the substrate 58 between the die 50 and the conductive strips 64. Rail 70C may be applied to the substrate 58 either prior to, or following bonding of, the die 50 thereto. The wires 62 are then bonded to the appropriate bond pads 52 and conductive strips 64. The rail 70C may be formed on one or more lateral sides 76 of the die and may be formed on all four sides of the die 50, providing an enclosure for the die. Rail 70C may extend a substantial distance above the substrate and above the active surface of the die, particularly if a rail 70C is the only rail employed to support wires 62. For example, rail 70C may extend from about 3 to about 30 mils above the substrates to suspend wires 62 over the long span from the edges of the die to bond pads 52.

Rails 70B and 70C have upper ends 72 which are rounded to avoid contact-induced, short radius bending of the wires 62. The rails 70B, 70C will support sagging wires 62 near the bond pads 52 and near the die edge 66, respectively. Either rail 70B or 70C may be used alone, or in combination as shown in FIG. 3.

FIG. 4 shows another embodiment of a non-conductive support rail, indicated as 70D. Rail 70D with rounded upper end 72 is applied to the die 50 near the edge 66 of the die and may circumscribe the active surface 54 of the die if desired.

Rails 70B, 70C, and 70D are formed of a non-conductive material which is secured to the die 50 or substrate 58 with an adhesive such as semiconductor-grade silicone adhesive. Materials from which the rail 70 may be formed include silicones, epoxies, polyimides, polyurethanes and other elastomers and plastics. The rails 70 may be preformed prior to application, or may be extruded or printed in place on the die or carrier substrate, or both. The rail or rails 70A and 70D may be applied to one or more edges 66 of the die 50 and may be applied to all four edges to circumscribe the die. Likewise, rails 70B may have closed ends to form a four-sided enclosure of the centrally positioned bond pads 52. Rails 70C may be applied to one or more sides of the die 50 and may form a circumscribed enclosure on carrier substrate 58 about the die.

Of course, where less than all of the bond pads 52 are aligned along the central axis 24, the rail 70 may be shorter. For a die 50 having a single long wire connection between pad 52 and substrate 58, the rail 70 may be relatively short, just enough to intercept and support the wire 62 should it sag. Similarly, for a die having a few central bond pads, discrete sections or segments of rail may be formed.

Figure 5:
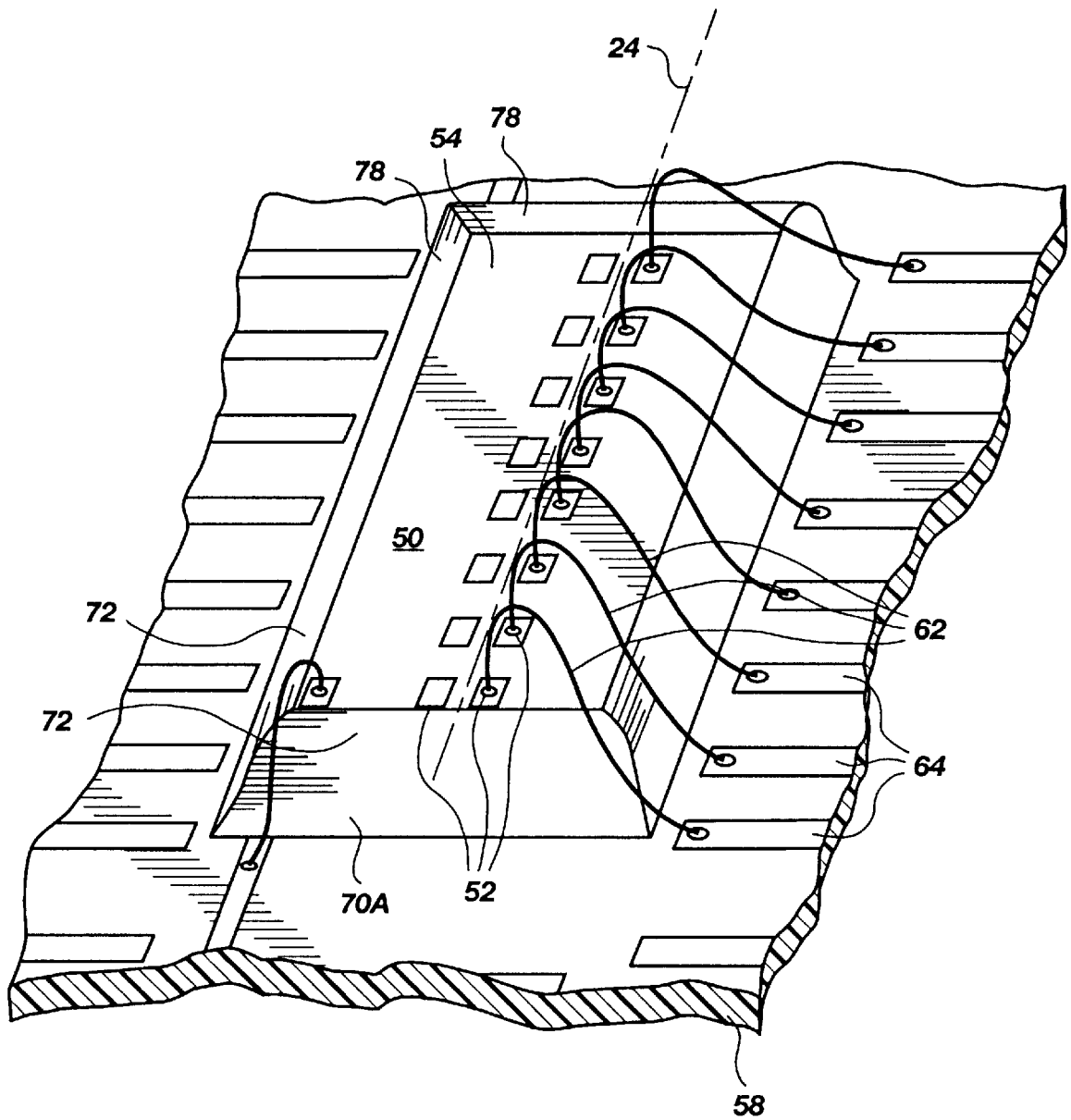
FIG. 5 is a perspective view of a portion of a carrier substrate showing a semiconductor die mounted thereon and having an insulative support rail of the invention applied to the die and substrate.

FIG. 5 shows a central bond pad (i.e. LOC type) die 50 which has been attached to a substrate 58. Most of the bond pads 52 lie along the central axis 24 of the die 50. Prior to connecting the long wires 62 between the bond pads 52 and conductive strips 64, a bead of polymeric material is applied as in FIG. 2 to form a rail 70A which covers the periphery of the active surface 54 and extends downward over the lateral sides of the die 50 to be joined to the substrate. In this embodiment, the rail 70A is applied on all four sides of the die. The rail 70A extends above the active surface 54 and has a rounded upper surface 72. The long metal wires 62 which are subject to sagging are prevented from contacting the sharp edges of the die 50. The rails 70A support the wires 62 and prevent undue sagging and possible contact with other bond pads 52, conductive strips 64, and each other. The wires 62 are thus held in place during the subsequent encapsulation process to prevent wire breakage and/or shorting subsequent to wire bonding. The rails 70A also provide additional bonding of the die 50 to the substrate 58 and reduce the quantity of encapsulant material required. Polymeric materials used for the rails 70A are preferably those which also have a relatively high heat conductivity, enabling an effective cooling of the dice 50 when in use. One such exemplary material is W. R. Grace Stycast 4952 thermally conductive encapsulant. Another is the particular encapsulant used to encapsulate the dice 50 and attached wires 62, such as Sumitomo S308R encapsulant.

While the process of forming the rails 70A may simply be one of applying a bead of flowable electrically non-conductive polymeric material along the die periphery, other processes may also be used. For example, a mold may be placed over the die 50 and a polymeric material pressure injected and permitted to harden to provide the rail 70A. Alternatively, the rails 70A may be separately molded as a preformed unit frame 78. The unitary frame 78 of rails 70A is then placed over the die 50 and bonded to the die 50 and underlying substrate 58 with adhesive. The frame 78 may even be first bonded to the die 50, following which the die and attached frame 78 of rails 70A are bonded as a unit to the substrate 58. Thus, the process is very amenable to automation by a variety of methods.

Figure 6:
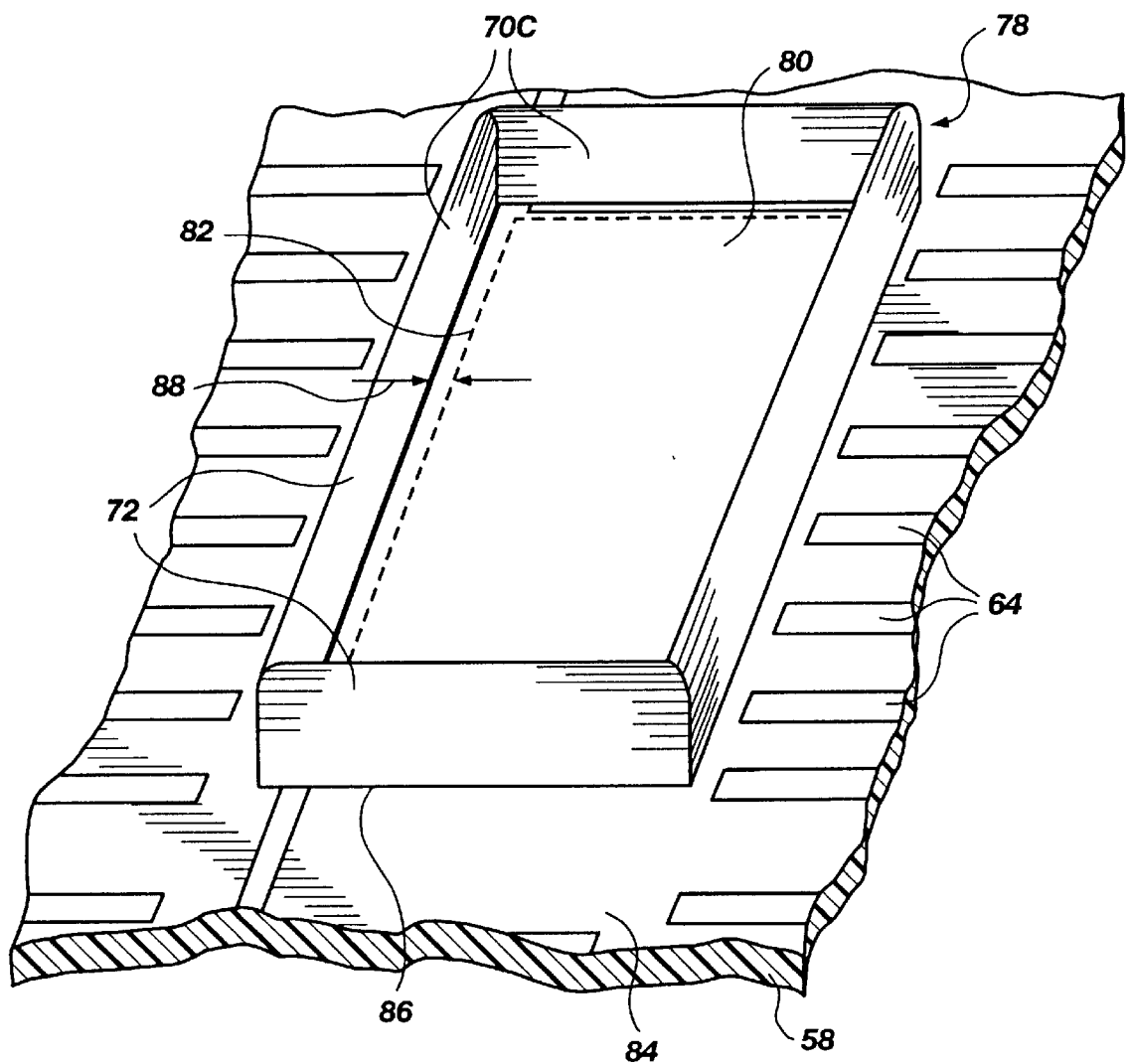
FIG. 6 is a perspective view of a portion of a substrate illustrating another embodiment of an insulative support rail of the invention applied to the carrier substrate prior to back-bonding of a die thereto.

Another embodiment of the invention in shown in FIG. 6. A frame 78 of rails 70C (see FIG. 3) is formed on the substrate 58 prior to bonding of the back side of a die 50 to the substrate 58. In this example, a ground conductive surface 80 overlies the upper surface 84 of the substrate 58 to which the die 50 is subsequently bonded. The die 50 is bonded to the predetermined die attach area 82 of conductive surface 80, denoted as lying within the hatched lines. The frame 78 is preferably separated from the die 50 by a distance of about at least 5 to 30 mils to enable essentially complete filling of the interstitial space 88 therebetween during subsequent sealing/encapsulation. As is well-known, cooling of the die 50 is reduced by a layer of air between the die and the encapsulating layer, not shown. Thus, sealing of the die 50 without air pockets and using a thermally-conductive material is desirable to promote adequate heat transfer.

The frame 78 may be formed in a mold and attached to the substrate 58 by adhesive 86. Alternatively, frame 78 may be formed by applying a flowable polymer onto the substrate surface 84 in a pattern which achieves the necessary height of rail 70 above the active die surface 54 and the anticipated spacing 88 between die 50 and rails 70. The die 50 is inserted and adhesively attached in the space within lines 82, after which the wires, not shown, may be attached between die pads and conductive surfaces 64. A large number of rails 70C or frames 78 may be formed on a substrate 58 at one time by screen-printing the polymer material onto the substrate to be closely proximate the predetermined die bond areas.

Alternatively, frame 78 may be formed on the in situ substrate surface 84, e.g. with a bead of adhesive silicone or polyimide material, or preform frames 78 secured to surface 84 following attachment of the die 50 to the substrate 58. However, pre-forming of the rail frames 78 on the substrate 58 or preattachment thereof before bonding of the dice 50 thereto is preferred.

Figure 7:
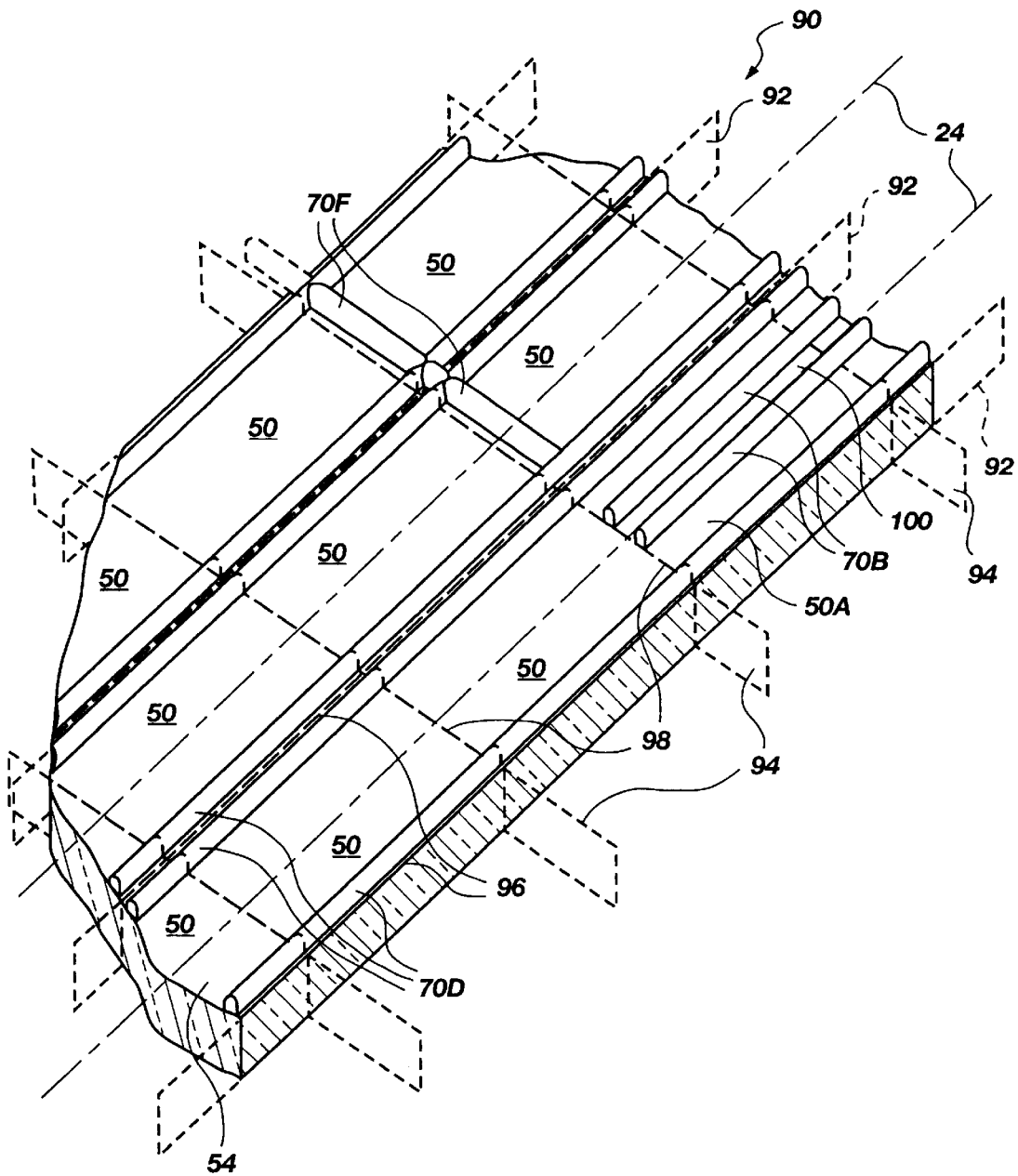
FIG. 7 is a perspective view of a portion of an unsingulated-die wafer illustrating application of insulative support rails of the invention prior to die singulation.

As shown in FIG. 7, rails 70 may be applied to location of the uncut or unsingulated dice 50 of a wafer 90 prior to dicing, i.e. die separation. As is well-known, a plurality of dice 50 is formed from a single wafer or other semiconductor substrate 90 (including, without limitation, silicon-on-insulative (SOI) and silicon-on-sapphire (SOS), as well as gallium arsenide and indium phosphide structures) by cutting the wafer along vertical cutting planes 92 and 94, which are perpendicular to each other. The projections of the cutting planes 92, 94 onto the active surface 54 of the portion of undivided wafer 90 are shown as lines 96 and 98, respectively. At least some of the bond pads, not shown, will be formed on the dies 50 on or near the central axes 24 of the dies or otherwise in a centralized region of the active surfaces and will require unusually long connection wires to the conductive strips on the substrate.

Longitudinal non-conductive rails 70D (see FIG. 4) are shown in FIG. 7 as applied to the wafer 90 parallel to and along the longitudinal cutting planes 92. Rails 70D may be applied as longitudinal beads of, for example, silicone, polyimide or other non-conductive flowable material and permitted to harden into supportive insulators for sagging wires.

Other sets of rails may also be applied to the wafer 90. For the purpose of illustration, portions of rails 70B (see also FIG. 3) are also shown, being positioned just outside of the subsequently installed central bond pad area 100 of die 50A.

Cross-rails 70F may also be applied to wafer 90 such that three or four sides of the active surface 54 of each die 50 are enclosed. This is also illustrated in FIG. 7, where cross-rails 70F are applied in a direction perpendicular to rails 70B and 70D.

As illustrated in FIG. 7, the rails 70D and 70F may be applied continuously across the scribe or cutting lines 96, 98. Thus, the rails are cut transversely prior to or during cutting and singulation of the dice.

Figure 8:
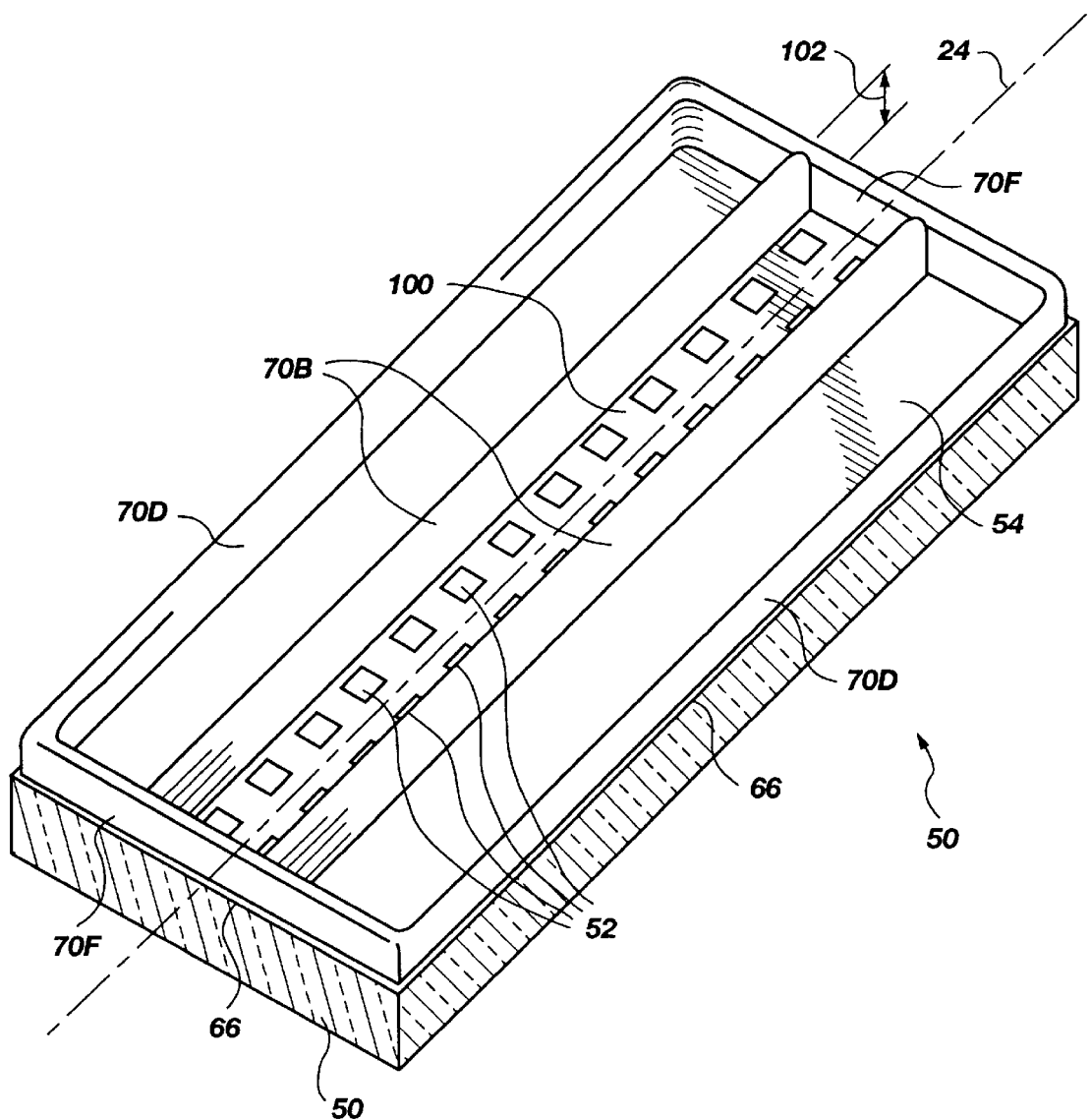
FIG. 8 is a perspective view of a die having central conductive bond pads and a further embodiment of insulative support rails of the invention applied thereon.

Alternatively, a pattern of rails 70 may be applied to each die 50 by screen-printing the insulative rail material onto the active surface 54 prior to die separation, such that no cutting of the rails 70 is required. FIG. 8 shows such a die 50 with (a) insulative support rails 70B outside central bond pads 52 along central axis 24, (b) insulative support rails 70D along the edges and parallel to rails 70B, and (c) insulative support cross-rails 70F perpendicular to rails 70B. All of the rails 70B, 70D and 70F are located within the edges 66 of the die 50 and are shown with rounded upper surfaces. Such an arrangement also provides excellent physical protection to the active surfaces of the dice during handling.

It will be noted that the direction of the central axis 24 for this discussion is generally in the longer dimension of the die 50, in order to reduce the wire length between bond pads and conductive strips as much as possible. The invention, however, is applicable regardless of the direction of the central axis 24 and is also, as previously mentioned, applicable to a square, circular or other centralized array of bond pads remote in all directions from the periphery of the die.

Figure 9:
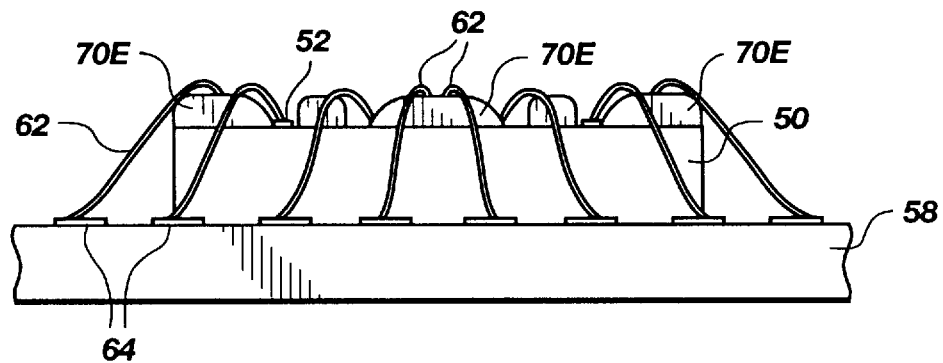
FIG. 9 is a side view of a semiconductor chip mounted on a carrier substrate and employing a further preferred discontinuous or segmented-rail embodiment of the insulative support rail of the invention.

FIG. 9 depicts an LOC die 50 with segmented or discontinuous rails 70E supporting bond wires 62 in the manner previously described according to the invention.

Figure 10:
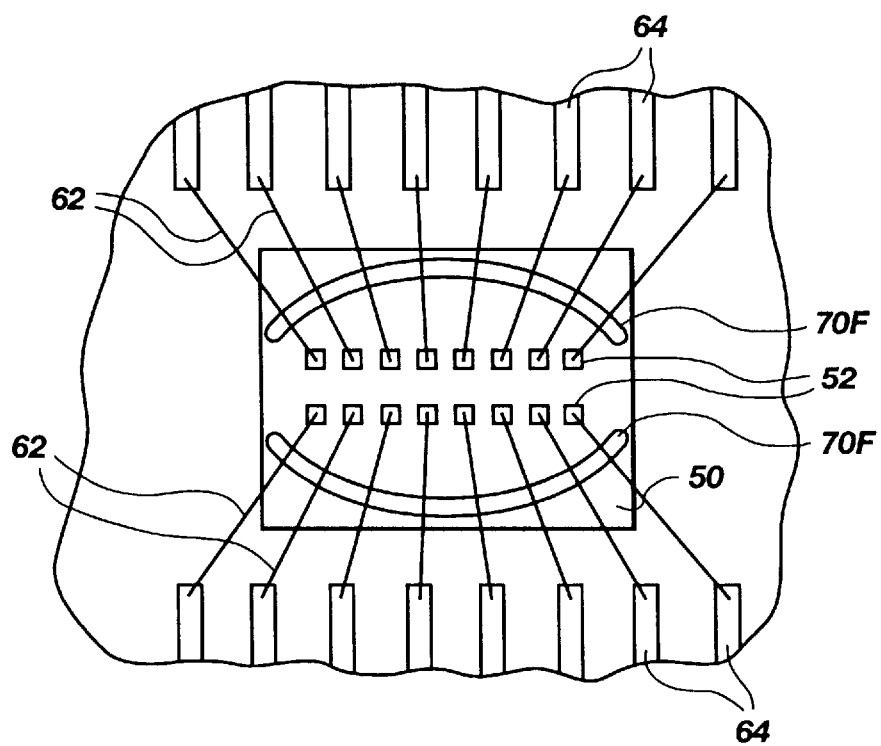
FIG. 10 is a top view of a semiconductor chip mounted on a carrier substrate and employing a further preferred arcuate embodiment of the insulative support rail of the invention.

FIG. 10 depicts an LOC die 50 from above, showing non-linear rails 70F disposed on the active surface 54 thereof supporting bond wires 62 fanning out from bond pads 52 to conductive strips 64 on all four sides of die 50.

Figure 11:
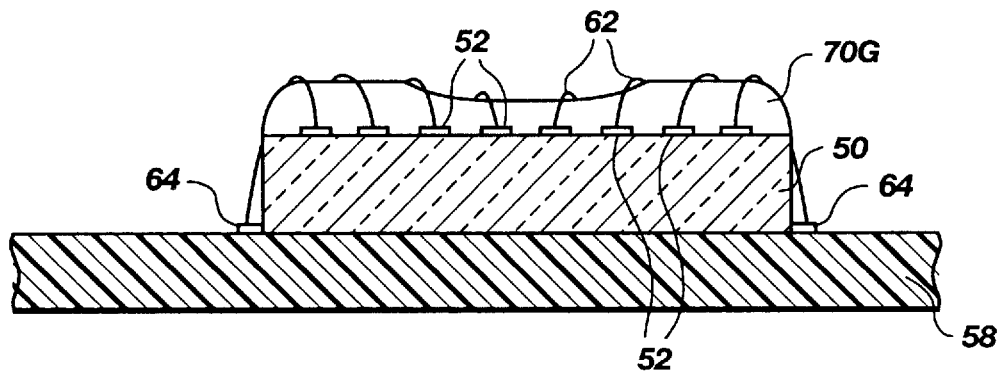
FIG. 11 is a cross-sectional view of a semiconductor chip mounted in a carrier substrate and employing a preferred multi-height insulative support rail of the invention.

FIG. 11 depicts a multi-height preformed rail 70G in a half-sectional side elevation of a die 50, taken along a center line thereof between the two central rows of bond pads 52.

Figure 12:
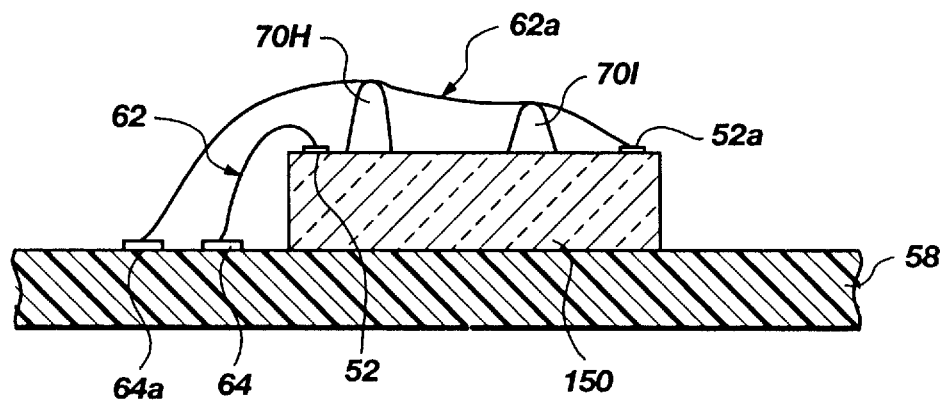
FIG. 12 depicts a non-LOC die mounted to a carrier substrate and employing insulative support rails of the invention.

FIG. 12 depicts a non-LOC (i.e., peripheral bond pad) die 150 using rails 70H and 70I to permit connection of bond pads 52a lining on one side of the die 150 via bond wires 62a to conductive strips 64, which are all disposed to the other side of the die 150.

The invention is applicable to dies 50 having at least one electrically conductive bond pad 52 so located that the length of the connecting wire 62 may result in sagging of the wire 62 between a die bond pad 52 and a substrate conductive strip 64. It is particularly useful for chips having some or all of the bond pads 52 remote from the die edge 66 and including dies 50 on SIMMs (single inline memory modules), DIMMS (dual inline memory modules) and multi-chip modules including a variety of chips such as microprocessors.

While the above describes the invention in terms of a single die 50 on a carrier substrate 58, it is to be interpreted as to be inclusive of carrier substrates to which a plurality of dies is attached and is preferably used in such multi-chip modules.

The rails 70 are preferably formed to be upstanding a distance 102 (FIG. 8) of about 1 to about 3 mils above the active surface 54 of the die. However, the rails 70 may extend as little as will provide an electrically insulating support for the wires 62, i.e. about 0.4 mils. Likewise, high rails 70 may extend more than about 8 mils above the active surface 54. As noted previously, when rails 70 are formed on the substrate so that wires 62 must span a large distance to central bond pads 52 on a die and such rails are the only support for such wires intermediate the terminal ends of the conductive traces and their associated bond pads, rails 70 may extend to a substantial elevation above the active surface of the die.

The width of the rail 70 need only be that which will provide sufficient strength for self-support and to support an intermediate portion of the wire(s) which it may engage. Typically, the width will be about 1 to about 3 times the rail height.

It is also contemplated that an uncured or only partially cured material such as a B-stage epoxy may be used as a rail or rail segment on either the die or carrier substrate, or both, and subsequently fully cured after the wire bonding operation and an intentionally-induced sag (as by centrifuge-type acceleration) of the bond wires into the rail material. The full curing of the rail material, which may be rapidly effected for example in a curing furnace, would secure all bond wires in place and inhibit potential changes thereto during further handling and encapsulant application.

Thus, dice designed for lead-over-chip (LOC) or internal-array-pad applications may be used on a simplier direct chip attach substrate with wire bonds of standard materials and methods. Further, and as previously described, the invention has utility for application with all conventionally-padded (non-LOC) dice.

It is anticipated that various changes and modifications may be made in the construction, arrangement, operation and method of construction of dies with insulative support rails disclosed herein without departing from the spirit and scope of the invention as defined in the following appended claims.

What is claimed is:

1. A semiconductor device, comprising:

a carrier substrate having a pattern of conductors on at least a first non-conductive surface thereof;

at least one semiconductor die having an active surface on a first side and an opposed side secured to said first surface of said substrate, said die having at least one bond pad remote from a peripheral edge of said active surface;

a bond wire connecting at least one conductor of said pattern on said substrate with said at least one remote bond pad, said bond wire extending over said peripheral edge of said active surface of said at least one die and having an intermediate portion between said at least one remote bond pad and said at least one conductor of sufficient length as to be non-self-supporting; and a support having an electrically insulating upper surface disposed under and supporting said intermediate bond wire portion.

2. The semiconductor device of claim 1, wherein said support is configured and positioned to intercept and support said intermediate portion of the bond wire under a collapsing condition thereof.

3. The semiconductor device of claim 1, wherein said support comprises a rail of electrically insulating material extending above the active surface.

4. The semiconductor device of claim 3, wherein said rail extends about 0.4 mils to about 8 mils above the active surface.

5. The semiconductor device of claim 1, wherein said support comprises a polymeric material.

6. The semiconductor device of claim 1, wherein said support comprises a polymeric material applied as a flowable material to one side of said at least one die and said substrate and subsequently cured.

7. The semiconductor device of claim 1, wherein said support is selected from the group of materials comprising silicones, polyimides, epoxies and polyurethanes.

8. The semiconductor device of claim 1, wherein said support comprises an encapsulant polymeric material.

9. The semiconductor device of claim 1, wherein said support comprises a rail of insulating material bonded to said active surface of said at least one die.

10. The semiconductor device of claim 1, wherein said support comprises a rail of insulating material bonded to said substrate.

11. The semiconductor device of claim 1, wherein said support comprises a rail of non-conductive polymeric material overcovering an edge of the active surface and extending downwardly to said first surface of said substrate.

12. The semiconductor device of claim 1, further comprising a non-conductive polymeric material encapsulating at least a portion of said at least one die and at least a portion of said bond wire.

13. The semiconductor device of claim 3, further comprising a non-conductive polymeric material encapsulating at least a portion of said at least one die at least a portion of said bond wire, and at least a portion of said rail.

14. The semiconductor device of claim 3, wherein said rail has a curved upper cross-sectional profile.

15. The semiconductor device of claim 1, wherein said carrier substrate is a printed circuit board.

16. The semiconductor device of claim 1, wherein said at least one die comprises a leads-over-chip (LOC) die.

17. The semiconductor device of claim 1, wherein said at least one die comprises a die of a SIMM (single in-line memory module).

18. The semiconductor device of claim 1, wherein said bond wire has a diameter of about 1 to 1.5 mils and a length of at least 100 mils.

19. The semiconductor device of claim 1, wherein said bond wire has a diameter of no more than about 2 mils and a length of at least 150 mils.

20. The semiconductor device of claim 1, wherein said bond wire has a diameter of no more than about 2.5 mils and a length of at least 250 mils.

21. A semiconductor die having an active surface for wire bonding to a remote substrate, said die comprising:
a body of semiconductor material having a region on said active surface remote from a periphery of said active surface;
at least one exposed bond pad within said region; and
a rail of non-conductive material attached to said active surface in a predetermined position intermediate said at least one bond pad and said periphery of said active surface to support a wire to be bonded to said at least one bond pad.

22. The semiconductor die of claim 21, wherein said rail extends upwardly from said active surface for a distance of about 0.4 mils to about 8 mils.

23. The semiconductor die of claim 21, wherein said rail has a width of about 1 to about 3.0 times the elevation thereof above the active surface.

24. The semiconductor die of claim 21, wherein said rail comprises a polymeric material applied to said die as a bead of flowable material and subsequently cured.

25. The semiconductor die of claim 21, wherein said rail is a polymeric material applied to said die by screen-printing.

26. The semiconductor die of claim 21, wherein said rail is positioned parallel to and proximate an edge of said active surface.

27. The semiconductor die of claim 21, wherein said rail is positioned proximate said bond pad and parallel to an edge of said active surface.

28. The semiconductor die of claim 21, wherein an array of bond pads is positioned within said remote region of said body of semiconductor material of said die, and said rail is positioned proximate said array in a continuous frame on all sides of said array.

29. The semiconductor die of claim 21, wherein said rail comprises a unitary frame of polymeric material applied as a bead thereof proximate all edges of said active surface and subsequently cured.

30. The semiconductor die of claim 21, wherein said rail is applied to multiple dies of an undivided wafer.

31. A structure for accommodating a semiconductor die having at least one electrically conductive bond pad remote from a die edge for bonding a wire thereto and to a conductive trace on said structure, said structure comprising:
a carrier having a first non-conductive surface;
electrically conductive traces comprising at least part of an electrical circuit on said first surface of said carrier;
a selected die attach area on said first surface for attaching said semiconductor die thereto; and
a rail of non-conductive material applied and bonded to said first surface adjacent said selected die attach area and projecting upwardly between an electrically conductive trace and said die attach area.

32. The structure of claim 31, wherein said rail projects upwardly to an elevation of about 3 to about 30 mils above said first surface of said carrier.

33. The structure of claim 31, wherein said rail has a width of about 1 to about 3 times an elevation thereof above said first surface of said carrier.

34. The structure of claim 31, wherein said rail comprises a polymer applied to said carrier in a flowable state.

35. The structure of claim 31, wherein said rail is applied to said carrier on opposing sides of said selected die attach area.

36. The structure of claim 31, wherein said rail is applied to said carrier narrowly spaced from said selected die attach area on all sides thereof to form a frame thereabout.

37. The structure of claim 31, further comprising a semiconductor die having an active surface and an opposing surface, said opposing surface bonded to said selected die attach area.

38. The structure of claim 31, wherein said rail is applied to said carrier in a position separated from said selected die attach area by about 5 to about 30 mils.

39. The structure of claim 31, wherein said carrier comprises a printed circuit board.

40. The structure of claim 31, wherein said rail comprises a polymer applied to said carrier by screen printing.

41. A method for making a semiconductor device from a die having an active surface bearing bond pads remote from a periphery of said active surface and a carrier substrate bearing conductive traces, comprising:
attaching said die to said substrate;
applying a bead of non-conductive material to form an upstanding rail between at least some of said bond pads and an edge of said active surface; and
bonding wires between at least some of said bond pads and corresponding conductive traces, said bond wires passing over said rail therebetween.

42. The method of claim 41, further comprising encapsulating said die, wires, and rail.

43. A method for making a semiconductor device from a die having an active surface bearing bond pads remote from a periphery of said active surface and a carrier substrate bearing conductive traces, comprising:
attaching said die to said substrate;
applying a bead of non-conductive material proximate said periphery of said active surface to form an upstanding rail between said bond pads and said periphery of said active surface; and
bonding wires between at least some of said bond pads and corresponding conductive traces, said bond wires passing over said rail therebetween.

44. The method of claim 43, further comprising encapsulating said die, wires, and rail.

45. A method for making a semiconductor device from a die and a carrier substrate, comprising:
attaching a die having an active surface bearing exposed bond pads remote from a periphery of said active surface to a carrier substrate bearing conductive traces thereon;
applying a bead of non-conductive material to said carrier substrate to form an upstanding rail between said die and said conductive traces; and
bonding wires between at least some of said bond pads and corresponding conductive traces and over said rail therebetween.

46. The method of claim 45, further comprising encapsulating said die, wires, and rail.

47. A method for making a semiconductor device from a lead-over-chip (LOC) die having an active surface bearing a bond pad remote from a periphery of said active surface and a carrier substrate bearing a conductive trace thereon, comprising:
screen printing an upstanding rail of non-conductive polymeric material on said active surface to underlie a wire subsequently bonded between said bond pad and said conductive trace;

attaching said die to said substrate; and bonding said bond wire between said bond pad and said conductive trace, said bond wire passing over said rail therebetween.

48. The method of claim 47, further comprising encapsulating said die, wire, and rail.

49. A method for making a semiconductor device from a lead-over-chip (LOC) die having electrical wire bond pads along a central axis and a carrier substrate bearing conductive traces, comprising:

forming a rail of insulating material on said substrate, said rail positioned in a predetermined location to lie beneath a subsequently attached wire connected between a bond pad of said die and a conductive trace of said substrate;

bonding an LOC die to said substrate adjacent said rail; and connecting a wire to said bond pad and to said conductive trace, said bond wire passing over said rail therebetween.

50. The method of claim 49, further comprising the step of encapsulating the die, wire, and rail with an electrically insulating polymeric encapsulant.

51. A semiconductor device, comprising:

a carrier substrate having at least one conductive trace on at least a first surface thereof;

at least one semiconductor die having an active surface on a first side thereof and an opposed side attached to the first surface of the carrier substrate, the at least one die having at least one exposed bond pad remote from a periphery of the active surface proximate the at least one conductive trace;

at least one wire connecting the at least one conductive trace with the at least one bond pad; and an electrically insulating support disposed under the at least one wire intermediate the at least one bond pad and the at least one conductive trace.

52. The semiconductor device of claim 51, wherein the at least one conductive trace comprises a plurality of traces, the at least one semiconductor die comprises a plurality of dice, and the at least one bond pad comprises a plurality of bond pads.

53. The semiconductor device of claim 51, wherein the electrically insulating support is elongate in configuration.

54. The semiconductor device of claim 53, wherein at least a segment of the electrically insulating support is nonlinear.

55. The semiconductor device of claim 53, wherein the electrically insulating support is of nonuniform height.

56. The semiconductor device of claim 51, wherein the electrically insulating support is located on the active surface of the at least one semiconductor die.

57. The semiconductor device of claim 51, wherein the electrically insulating support is located on the first surface of the carrier substrate.

58. The semiconductor device of claim 51, further comprising a second electrically insulating support disposed intermediate the at least one bond pad and the at least one conductive trace.

59. The semiconductor device of claim 58, wherein at least one of the insulating support and the second insulating support are located on the active surface of the at least one semiconductor die.

60. The semiconductor device of claim 58, wherein at least one of the insulating support and the second insulating support are located on the first surface of the carrier substrate.

61. The semiconductor device of claim 51, wherein the insulating support comprises a preform element secured to the at least one semiconductor die.

62. The semiconductor device of claim 51, wherein the insulating support is formed in place on the at least one semiconductor die.

63. The semiconductor device of claim 51, wherein the insulating support is secured directly only to the at least one semiconductor die.

64. The semiconductor device of claim 51, wherein the insulating support is secured directly only to the first surface of the carrier substrate.

65. The semiconductor device of claim 51, wherein the at least one bond pad comprises a plurality of bond pads, and the insulating support substantially surrounds the plurality of bond pads.

66. The semiconductor device of claim 65, wherein the insulating support is substantially continuous.

67. A method of making a semiconductor die for wire-bonding, comprising:

providing a substrate of semiconductor material having an active surface with a plurality of semiconductor die locations defined thereon, each of said locations including a plurality of bond pads; and placing insulating support members on said semiconductor substrate active surface at said plurality of semiconductor die locations.

68. The method of claim 67, wherein said insulating support members are placed between at least some of said bond pads of a semiconductor die location and a boundary of said location.

69. The method of claim 67, further including singulating semiconductor dice corresponding to said plurality of die locations from said semiconductor substrate.

70. The method of claim 69, wherein singulating is effected subsequent to placement of said insulating support members on said semiconductor substrate active surface.

71. The method of claim 67, wherein placing said insulating support members comprises placing a substantially continuous insulating support member surrounding said plurality of bond pads at said plurality of semiconductor die locations.

72. A method of fabricating a carrier substrate for supporting a plurality of semiconductor dice in a multi-chip module configuration, comprising:

providing a carrier substrate having a plurality of die-attach locations thereon and carrying conductive traces in a pattern arranged for effecting wire bonds between at least some of said conductive traces and semiconductor dice secured to said support member at said die-attach locations; and placing insulating support members on said carrier substrate proximate at least some of said plurality of die-attach locations and between said at least some of said plurality of locations and at least some of said conductive traces proximate those die-attach locations.

73. The method of claim 72, further comprising attaching semiconductor dice to said carrier substrate on at least some of said plurality of die-attach locations.

74. The method of claim 73, further comprising extending bond wires between at least some of said semiconductor dice and at least some of said conductive traces and over said insulating support members placed therebetween.

75. The method of claim 74, further including substantially encapsulating said at least some of said semiconductor dice and bond wires with a dielectric material.

* * * * *

UNITED STATES PATENT AND TRADEMARK OFFICE
CERTIFICATE OF CORRECTION

PATENT NO. : 5,847,445
DATED : December 8, 1998
INVENTOR(S) : Wark et al.

It is certified that error appears in the above-identified patent and that said Letters Patent is hereby corrected as shown below:

Column 8,    line 6,    delete "location" and insert --locations--.

Claim 23,    Column 11,    line 24,    delete "the" and insert --an--.

Claim 27,    Column 11,    line 36,    after "said" insert --at least one--.

Claim 43,    Column 12,    line 42,    delete "bond".

Signed and Sealed this

Twenty-eighth Day of December, 1999

Attest:

Q. TODD DICKINSON

*Attesting Officer*    *Acting Commissioner of Patents and Trademarks*